United States Patent [19]

Imamura

[11] 4,190,803
[45] Feb. 26, 1980

[54] MULTIFREQUENCY SUPERHETERODYNE RECEIVER WITH PRIORITY CHANNEL MONITORING

[75] Inventor: Eigo Imamura, Moriguchi, Japan

[73] Assignee: Sanyo Electric Company, Ltd., Moriguchi, Japan

[21] Appl. No.: 899,718

[22] Filed: Apr. 25, 1978

[30] Foreign Application Priority Data

Apr. 25, 1977 [JP] Japan .................. 52-48896

[51] Int. Cl.² .......................................... H04B 1/32
[52] U.S. Cl. ................... 325/455; 325/470; 325/457
[58] Field of Search ............... 325/334, 432, 433, 464, 325/468–470, 405, 408, 455

[56] References Cited

U.S. PATENT DOCUMENTS

| 3,470,481 | 9/1969 | Myers et al. | 325/470 |
| 3,482,166 | 12/1969 | Gleason | 325/470 |
| 3,497,813 | 2/1970 | Gallagher | 325/470 |
| 3,614,621 | 10/1971 | Chapman | 325/469 |
| 3,617,895 | 11/1971 | Tomsa et al. | 325/470 |
| 3,619,788 | 11/1971 | Giles, Jr. et al. | 325/470 |
| 3,714,580 | 1/1973 | Close | 325/470 |

Primary Examiner—Robert L. Griffin
Assistant Examiner—Jin F. Ng
Attorney, Agent, or Firm—Darby & Darby

[57] ABSTRACT

A superheterodyne receiver includes a first mixer operative to provide reception on a nonpriority channel upon receipt of output signal from a first oscillator, a second mixer operative to provide reception on a priority channel upon receipt of output signal from a second oscillator. A switching system coupled with a pulse generator is connected to the first and second oscillators for alternately operating the first and second mixers. When the receiver receives the priority channel through the second mixer, the pulse generator is locked to inhibit the generation of pulses which would enable the first oscillator and mixer and to continually receive the priority channel.

10 Claims, 4 Drawing Figures

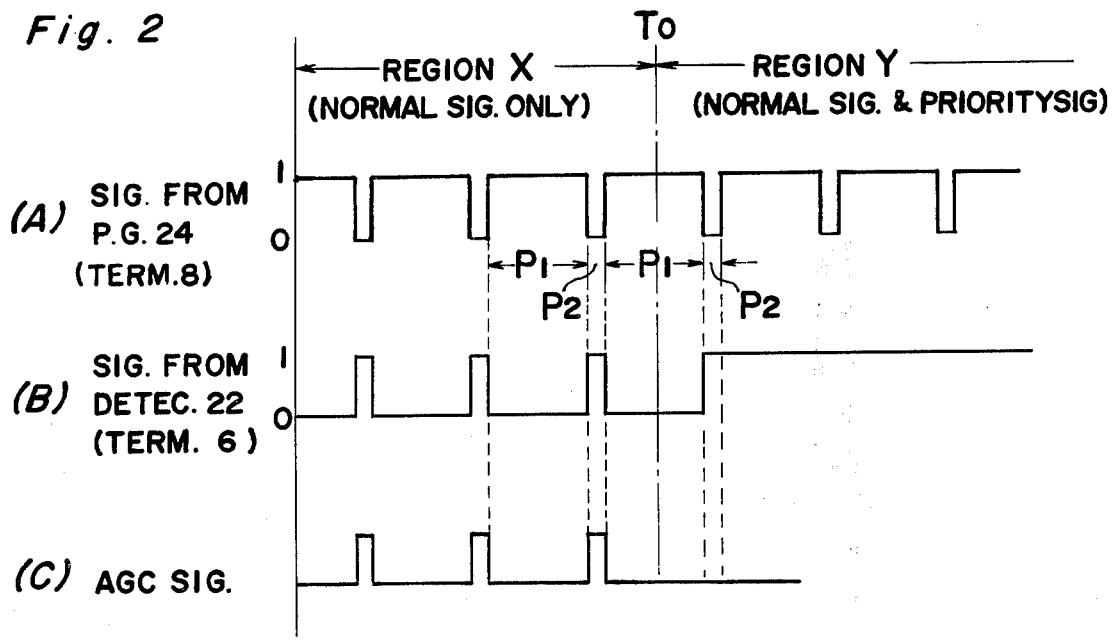

| TYPS OF RADIO-WAVE SIGNAL RECEIVING | AGC | OUTPUTS & INPUTS TO TERMINALS OF THE INTEGRATED CIRCUIT 42 | | | | | |
|---|---|---|---|---|---|---|---|
| | | ① IN | ② IN | ③ OUT | ④ IN | ⑤ IN | ⑥ OUT |
| I) NORMAL RADIOWAVE SIG. RECEIVED THRU. 1ST SER. CIR | LOW | HIGH | LOW | HIGH | HIGH | HIGH | LOW |
| II) NO PRIORITY RADIO-WAVE SIG. RECEIVED THRU. 2D SER. CIR | HIGH | LOW | HIGH | HIGH | HIGH | LOW | HIGH |
| III) PRIORITY RADIO-WAVE SIG. RECEIVED THRU. 2D SER. CIR | LOW | HIGH | HIGH | LOW | LOW | HIGH or LOW | HIGH |
| IV) NO RADIOWAVE SIG. RECEIVED | HIGH | LOW | HIGH or LOW | HIGH | HIGH | LOW or HIGH | HIGH or LOW |

MULTIFREQUENCY SUPERHETERODYNE RECEIVER WITH PRIORITY CHANNEL MONITORING

BACKGROUND OF THE INVENTION

The present invention relates to a receiver and, more particularly, to a multiple frequency receiver having switching apparatus for selecting any one of a plurality of tuning elements to provide reception on one of a plurality of different channels of radiowaves.

In the receiver of the above described type, the channel elements may be selected by a manual selector switch or by some automatic control system. In some cases it is desired to accord a priority to one channel and to receive such priority channel at all times during which a signal is transmitted thereon. In the absence of a signal on the priority channel the receiver may operate on another channel or may operate on a plurality of other channels at different times.

For example, in a citizen band receiver, a plurality of channels are available for, communication, in which one channel is designated for emergency uses. Conventionally, there have been proposed various types of receivers which automatically sample the priority channel intermittently during the reception of the normal channels. One type of a conventional type receiver is disclosed in U.S. Pat. No. 3,614,621 to Ronald H. Chapman patented on Oct. 19, 1971, and U.S. Pat. No. 3,497,813 to Thomas Gallagher patented on Oct. 24, 1970, in which there is provided means for detecting the presence of a received signal by the detection of noise. When the receiver is particularly designed for receiving a frequency modulation (FM) signal, the level of the noise becomes considerably low during the receiver receiving an FM signal, and the level of the becomes considerably high during the receiver not receiving the FM signal. However, such difference in the noise level do not appear in the case where the receiver is particularly designed for receiving amplitude modulation (AM) signal.

SUMMARY OF THE INVENTION

Accordingly, a primary object of the present invention is to provide a multifrequency superheterodyne receiver operable on a plurality of channels with a priority channel being sampled during reception of a signal from a nonpriority channel.

Another object of the present invention is to provide a multifrequency superheterodyne receiver of the above described type which can detect the presence of the priority channel without using the signal indicative of noise, by using an AGC signal.

A further object of the present invention is to provide a multifrequency superheterodyne receiver of the above described type which maintains the AGC signal in a stable condition.

Still further object of the present invention is to provide a multifrequency superheterodyne receiver of the above described type which is simple in construction and can readily be manufactured at low cost.

In accordance with a preferred embodiment of the invention, a superheterodyne receiver includes a first mixing means operative to provide reception on the nonpriority channels upon receipt of signal from a first oscillator means connected to the first mixing means. A second mixing means connected in parallel to the first mixing means is operative to provide reception on the priority channel upon receipt of signal from a second oscillator means connected to the second mixing means. A pulse responsive switching means having first and second conditions of operation is provided for operating the first mixing means and the first oscillator means when the switching means is in the first condition and for operating the second mixing means and the second oscillator means when the switching means is in the second condition. A pulse generating means is connected to the switching means for providing binary pulses having low and high output levels to the switching means. The switching means is turned to the first condition when the low output level is supplied thereto, and the switching means is turned to the second condition when the high output level is supplied thereto.

A detecting means is provided for detecting the reception of the priority channel by the second mixing means during a period in which the pulse generating means produces the high output level. The receiver further includes a means responsive to the detection of the detecting means for locking the pulse generating means to inhibit the generation of pulses and to continually produce a high output level.

The detection of the reception of the priority channel is effected by the use of an automatic gain control (AGC) signal produced from the receiver. When the reception is particularly designed for AM receiver, the level of the AGC signal becomes lower than a predetermined level during the receiver receiving a radiowave signal on some channel and, the level of the AGC signal becomes highe than the predetermined level during the receiver receiving no radiowave signal. Therefore, during the sampling of the priority channel, the receiver of the present invention can automatically lock onto the priority channel and can maintain the receiver to continually receive the priority channel until the termination of the signal. Furthermore, by selecting the predetermined level to be a comparatively high level, a priority channel having a weak signal can be detected.

Although the above described preferred embodiment is particularly directed to a reverse AGC system, it is possible to apply a forward AGC system.

Accordingly, since the AGC signal changes its level in response to the condition of reception of radio-wave signals, the superheterodyne receiver of the present invention can automatically receive the signal on the priority channel with high reliability.

BRIEF DESCRIPTION OF THE DRAWINGS

These and other objects and features of the present invention will become apparent from the following description of the preferred embodiment thereof with reference to the accompanying drawings, in which:

FIG. 2 is a graph showing waveforms of signals appearing at various places in the receiver;

FIG. 4 is a chart indicating the conditions of the binary signals appearing at various places in the circuit of FIG. 3.

DETAILED DESCRIPTION OF THE INVENTION

Figure 1:
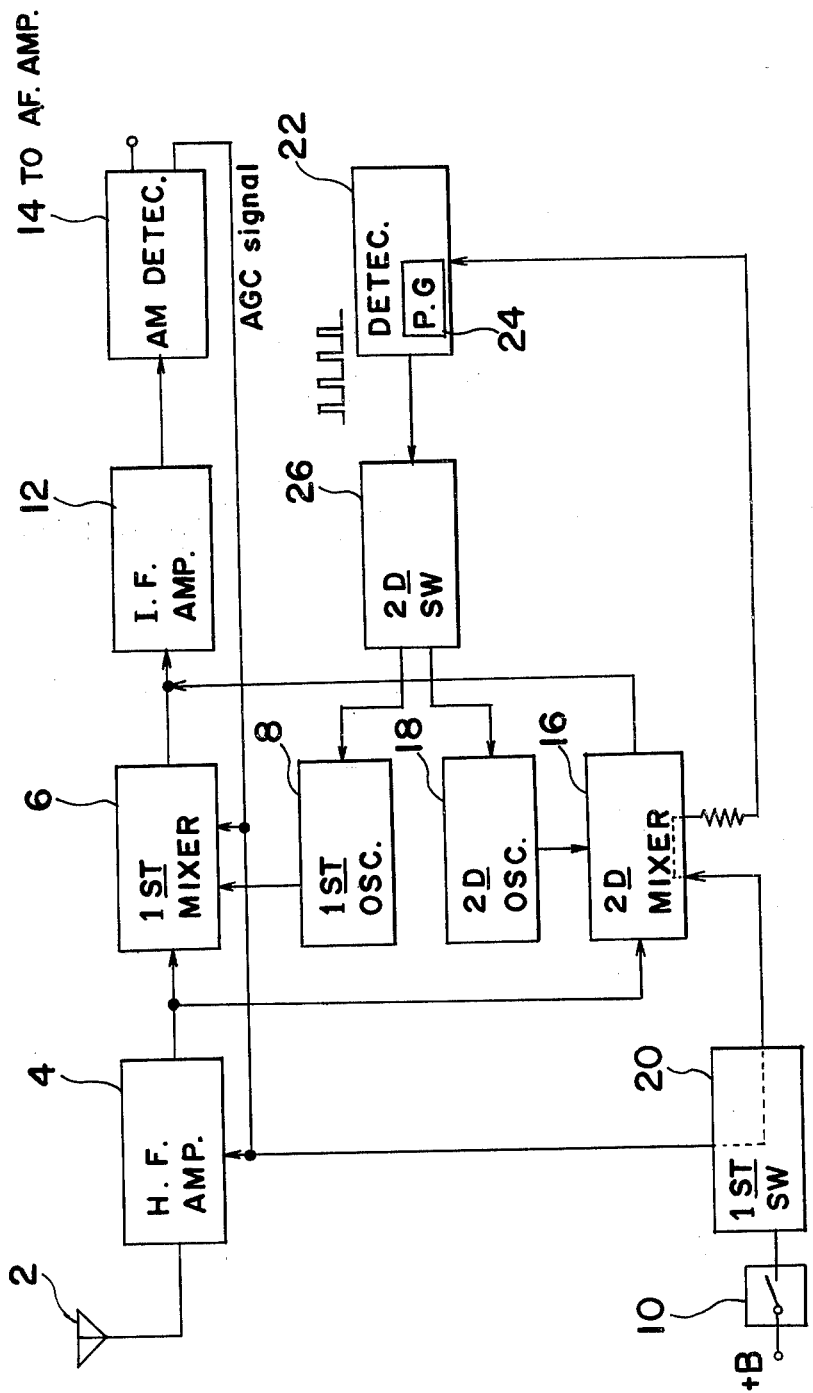
FIG. 1 is a schematic block diagram of a superheterodyne receiver according to a preferred embodiment of the present invention.

Before the description of the present invention proceeds, it is to be noted that like parts are designated by like reference numerals throughout the accompanying drawings.

Referring to FIG. 1, there is shown a receiver of the superheterodyne type wherein signals are received by an antenna 2, amplified by a high frequency amplifier 4 and applied to a first mixer 6. An output signal from the first mixer 6 is controlled by a selected single frequency of a local oscillator 8 in any known manner. The output from the first mixer 6 is applied to an intermediate frequency amplifier 12 and, in turn, to an AM detector 14. The AM detector 14 produces an audio signal which is fed to an audio frequency amplifier (not shown) and also produces an automatic gain control signal, referred to as AGC signal hereinafter, which is fed back to the high frequency amplifier 4 and to the first mixer 6.

A second mixer 16 is connected in parallel with the first mixer 6 and is coupled with a second local oscillator 18 for controlling the output signal from the second mixer 16. The combination of the second mixer 16 and the second local oscillator 18 operates to receive a priority signal while the combination of the first mixer 6 and the first oscillator 8 operates to receive other non-priority signals. These other signals are, hereinafter, referred to as normal signal in contrast to the priority signal. A first switching circuit 20 is connected between the AM detector 14 and the second mixer 16 and operates simultaneously with a main switch 10 coupled thereto. When the main switch 10 is ON, the AM detector 14 is connected to the second mixer 16 to supply the AGC signal to the second mixer 16. In the second mixer 16, the AGC signal is used to detect whether or not any signal is received by the receiver. When a signal, such as normal signal or priority signal is received, the level of the AGC signal assumes a low amplitude state and, when no signal is received, the level of the AGC signal assumes a high amplitude state. The AGC signal passing through second mixer 16, indicating the presence or absence of the received signal, is fed to a detector 22 which includes a pulse generator 24. The output signal from the detector 22, when a priority signal is not received but only a normal signal is received, is in the form of a train of pulses, as shown in a region X in waveform B of FIG. 2. The pulses of this train are successively produced one at a time at an interval of, for example 1 to 1.5 seconds, and the duration of each pulse of this train is 100 to 200 milliseconds. This pulse train is fed to a second switching circuit 26 and further to the first and second oscillators 8 and 18 for alternately operating the first and second oscillators 8 and 18.

During the absence of the pulse, that is, during a period $P_1$ shown in FIG. 2, the second switching circuit 26 turns on the first oscillator 8 to operate the first mixer 6 and, during the same period the second oscillator 18 is maintained OFF. Accordingly, the receiver is ready to receive normal radiowave signals through a first series circuit of the high frequency amplifier 4, first mixer 6, intermediate frequency amplifier 12 and AM detector 14.

On the other hand, during the presence of the pulse, that is, during a period $P_2$ shown in FIG. 2, the second switching circuit 26 turns on the second oscillator 18 to operate the second mixer 16 and, during the same, the first oscillator 8 is maintain OFF. Accordingly, the receiver the is ready to receive priority radiowave signal through a second series circuit of the high frequency amplifier 4, second mixer 16, intermediate frequency amplifier 12 and AM detector 14.

In other words, the pulsating signal from the detector 22 is used to effect sampling of the priority signal during the time in which the receiver receives the normal radiowave signal. The receiver described above operates in a manner given hereinbelow with reference to FIG. 2.

Referring to FIG. 2, during the period $P_1$ a low level signal produced from the detector 22 is applied to the second switching circuit 26 to operate the first oscillator 8. Thereupon the first series circuit is established in the receiver to receive the normal radiowave signals. During the period $P_1$, when the antenna 2 receives a normal radiowave signal, as the case is given as one example in a region X in FIG. 2, the normal radiowave signal is transmitted through the first series circuit to cause the AM detector 14 to produce a comparatively low amplitude AGC signal, as shown by a waveform C in FIG. 2.

During the period $P_2$, a high level signal produced from the detector 22 is applied to the second switching circuit 26 to operate the second oscillator 18. Thereupon the second series circuit is established in the receiver to receive the priority radiowave signal. However, if the antenna 2 does not receive any priority radiowave signal, the established second series circuit may not receive any signal. Thus, during the period $P_2$, the AGC signal is high, as shown by the waveform C of FIG. 2. Therefore, in the case as given in the region X, the operator may sense, or hear, the audio signal of the normal radiowave signal intermittently. However, since the duration of each of the pulse of the train is extremely short in comparison with the duration of interval between each adjacent pair of pulses, the intermittent audio signal is appreciably audible to the human ears. Accordingly, in the case described above in connection with the region X, the AGC signal produced from the AM detector 14 also pulsates at the same frequency as the frequency of the pulsating signal produced from the detector 22. Such pulsating AGC signal is fed to the detector 22 through the first switching circuit 20 and second mixer 16 for controlling the detector 22 to continuously produce the pulsating signal.

When the antenna 2 receives the priority radiowave signal in addition to the normal radiowave signal, the receiver operates in a different manner as described hereinbelow.

During the period $P_1$, the low signal produced from the detector 22 is applied to the second switching circuit 26 to operate the first oscillator 8 to establish the first series circuit and, to produce low AGC signal from the AM detector 14 in the same manner described above. If the antenna 2 receives the priority radiowave signal within the period $P_1$ and at the time $T_0$ as shown in FIG. 2, the second series circuit established in the next occuring sampling period $P_2$ receives the priority radiowave signal. Therefore, in said sampling period $P_2$, the AGC signal produced from the AM detector 14 is of a low amplitude. Upon receipt of such low amplitude AGC signal during the period $P_2$, the detector 22 maintains the output signal therefrom at a high level state. Therefore, regardless of the pulsating signal produced from the pulse generator 24, the detector 22 produces the high level signal to keep the second series circuit operating to receive the priority radiowave signal. In other words, the application of the low AGC signal to the detector 22 during the period $P_2$ holds the output signal from the detector 22 in the high level state.

Thereafter, when the priority radiowave signal ceases, the AGC signal becomes high and, therefore, the signal produced from the detector 22 starts to pulsate in the same manner as described above in connection with the region X.

Accordingly, the receiver of the present invention is operated to establish the second series circuit for a short time, such as 100 to 200 milliseconds, to detect the priority radiowave signal. When the priority radiowave is received, the detector 22 locks the receiver to continually hold the second series circuit to receive the priority radiowave signal until the priority signal ceases. During the receipt of the priority signal, the operator may, at any time, return the receiver to receive the normal radiowave signal by manually turning the switch 10 off which causes the switching circuit 20 to be deenergized.

It is to be noted that the detector 22 may lock the receiver in position to continually hold the second series circuit to receive the priority radiowave signal even if such priority radiowave signal is received by the antenna 2 during the period $P_2$.

Figure 3:
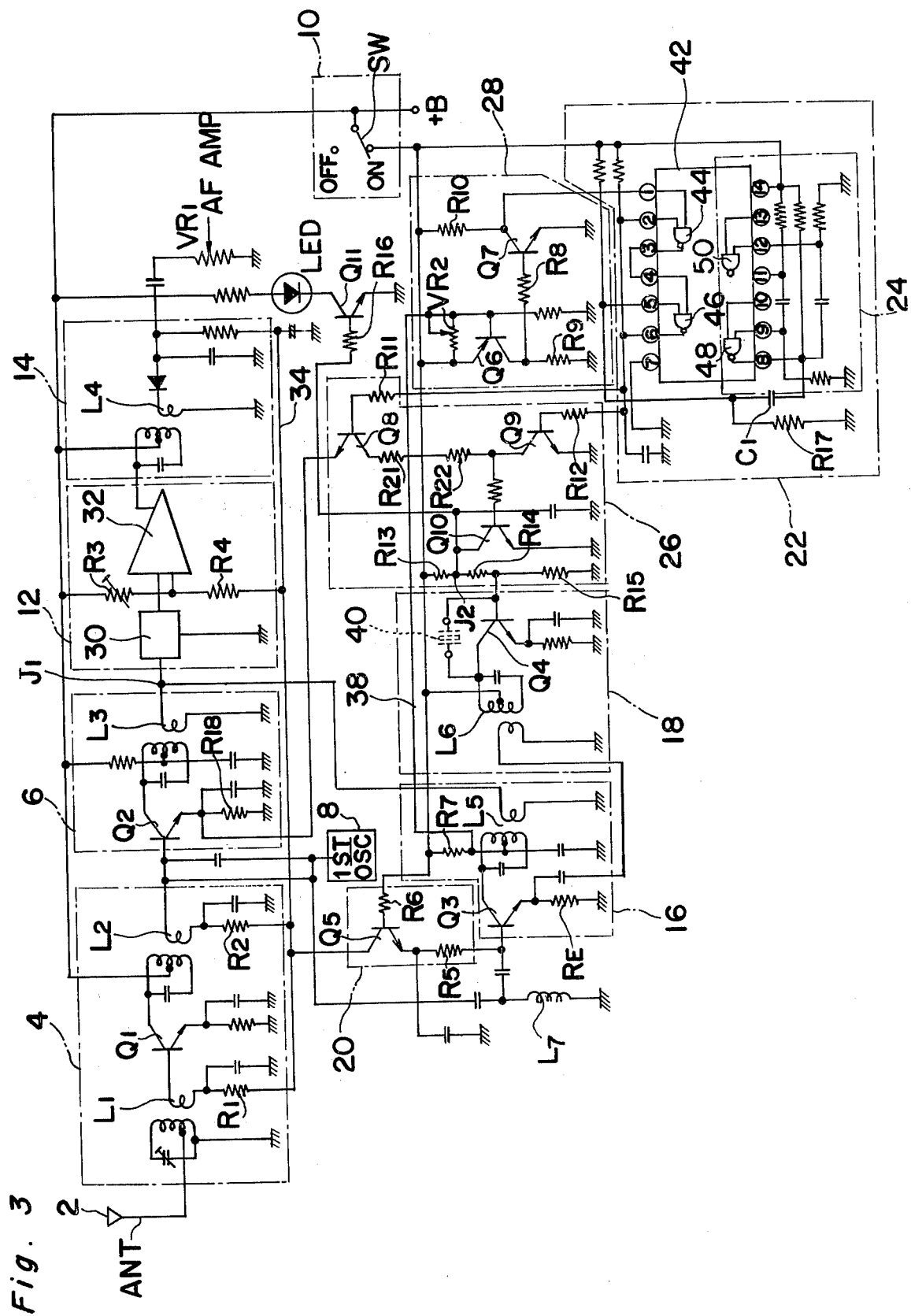
FIG. 3 is a circuit diagram showing the details of the embodiment of the superheterodyne receiver shown in FIG. 1.

In practice, the receiver shown in FIG. 1 can be implemented in the circuit as shown in FIG. 3. However, it is to be noted that the second switching circuit 26, which has been described as connected to the first and second oscillators 8 and 18, is so arranged as to control the first mixer 6 and the second oscillator 18 for establishing the first and second series circuits. The reason for this is because the oscillator 8 employed in the embodiment shown in FIG. 3 is preferably controlled by a phase locked loop (PLL) circuit which normally has a delay before it oscillates in a stable condition. Therefore, in order to sequentially establish and interrupt the first series circuit, the second switching circuit controls the first mixer 6, instead of the first oscillator 8 such as described with reference to FIG. 1.

Referring now to FIG. 3, the high frequency amplifier 4 includes a first tuning coil $L_1$, an emitter grounded transistor $Q_1$ whose base is connected to the secondary side of the tuning coil $L_1$ and a second tuning coil $L_2$ connected to the collector of the transistor $Q_1$. The secondary side of the tuning coil $L_2$ is connected to the base of an emitter grounded transistor $Q_2$ which is included in the first mixer 6. The first mixer 6 further includes a third tuning coil $L_3$. The secondary side of the third tuning coil $L_3$ is connected, through a common junction $J_1$, to a ceramic filter 30 of the intermediate frequency amplifier 12. An output of the filter 30 is connected to one of two inputs of an operational amplifier 32 which amplifies the signal of the intermediate frequency. The other input of the operational amplifier 32 is connected to the junction of a variable resistor $R_3$ and a fixed resistor $R_4$. An output of the operational amplifier 32 is connected to a fourth tuning coil $L_4$ provided in the AM detector 14. An output from the tuning coil $L_4$ is connected, through a variable resistor $VR_1$, to the audio frequency amplifier (not shown) and is also fed through a lead line 34 back to the second tuning coil $L_2$ through a resistor $R_2$ as the AGC signal and also to the first tuning coil $L_1$ through a resistor $R_1$. The AGC signal is also fed back to the operational amplifier 32. For controlling the output signal from the first mixer 6, the first oscillator 8 output is applied to the base of the transistor $Q_2$. It is to be noted that the oscillator 8 of this embodiment employs a phase locked loop circuit.

An output of the high frequency amplifier 4 is also connected to the second mixer 16 which includes an emitter grounded transistor $Q_3$ and a fifth tuning coil $L_5$ connected to the collector of the transistor $Q_3$. The primary winding of the fifth tuning coil $L_5$ is connected to the main switch 10 through a resistor $R_7$ and also connected, through a lead line 38, to an adjusting circuit 28 to be described later. The secondary winding of the fifth tuning coil $L_5$ is connected to the common junction $J_1$ between the secondary winding of the third tuning coil $L_3$ and the filter 30. The second oscillator 18 which is coupled to the second mixer 16 includes a sixth tuning coil $L_6$, a transistor $Q_4$ and an oscillating element 40 such as quartz-crystal oscillator. The primary winding of the sixth tuning coil $L_6$ is connected to the transistor $Q_4$ and the oscillating element 40 while the secondary winding of the sixth tuning coil $L_6$ is connected to the emitter of the transistor $Q_3$.

The first switching circuit 20 includes a transistor $Q_5$ having its collector connected to the AGC lead line 34, and its emitter connected, through a resistor $R_5$, to the base of the transistor $Q_3$ and its base connected, through a resistor $R_6$, to the main switch 10.

The adjusting circuit 28 includes transistors $Q_6$ and $Q_7$, variable resistor $VR_2$ and resistors $R_8$, $R_9$ and $R_{10}$. The lead line 38 extending from the fifth tuning coil $L_5$ is connected to the base of the transistor $Q_6$. The variable resistor $VR_2$ is connected between the emitter and base of the transistor $Q_6$. The collector of the transistor $Q_6$ is connected to the ground through the resistor $R_9$ and also connected to the base of the emitter grounded transistor $Q_7$ through the resistor $R_8$. The collector of the transistor $Q_7$ is connected to the main switch 10 through the resistor $R_{10}$ and also to a first terminal of a quad NAND gate integrated circuit 42 provided as part of the detector 22. The integrated circuit 42 is so constituted as to include four NAND elements 44, 46, 48 and 50 and fourteen terminals for external electric connection. The first and second terminals are connected to first and second inputs, respectively of the NAND element 44, and the fourth terminal is connected to the output of the same NAND element 44. Likewise, the fourth, fifth and sixth terminals are connected to first and second inputs and output of the NAND element 46. The eighth terminal is connected to output of the NAND element 48 and ninth and tenth terminals are connected to first and second terminals of the NAND element 48. Likewise, the eleventh, twelfth and thirteenth terminals are connected to output and first and second inputs of the NAND element 50. The seventh terminal is provided for grounding the integrated circuit 42 and the fourteenth terminal is provided for the application of electric power.

It is to be noted that the NAND elements 48 and 50 constitute, together with externally connected electric elements such as resistors and capacitors, an astable multi-vibrator, corresponding to pulse generator 24 shown in FIG. 1, for generating a train of pulses as shown by a waveform A in FIG. 2 from the eighth terminal. The pulses are supplied to the fifth terminal, and the sixth terminal produces the controlling signal, as shown by the waveform B in FIG. 2, which is applied to the second switching circuit 26. The second terminal is connected to the sixth terminal and the third terminal is connected to the fourth terminal.

The second switching circuit 26 includes transistors $Q_8$, $Q_9$ and $Q_{10}$ and resistors $R_{11}$, $R_{12}$, $R_{13}$, $R_{14}$, $R_{15}$, $R_{21}$ and $R_{22}$. The transistor $Q_8$ has its base connected, through the resistor $R_{11}$, to the sixth terminal of the integrated circuit 42. The collector of the transistor $Q_8$ is connected, through the resistors $R_{21}$ and $R_{22}$, to the collector of the transistor $Q_9$, while the emitter of the transistor $Q_8$ is connected to the emitter of the transistor $Q_2$ and is further grounded through a resistor $R_{18}$. The transistor $Q_9$ has its base connected, through the resistor $R_{12}$, to the sixth terminal of the integrated circuit 42. The collector of the transistor $Q_9$ is connected to the base of the transistor $Q_{10}$ through a suitable resistor, while the emitter thereof is connected to ground. The transistor $Q_{10}$ has its collector connected to the base of the transistor $Q_4$ through the resistor $R_{14}$, while the emitter thereof is grounded. The resistors $R_{13}$, $R_{14}$ and $R_{15}$ are connected in series between the main switch 10 and the ground. The collector of the transistor $Q_{10}$ is also connected to a switching transistor $Q_{11}$ through a resistor $R_{16}$ for turning on and off a light emitting diode LED. The function of the receiver described above is given hereinbelow.

Starting from a condition that the main switch 10 is in OFF and, that the antenna 2 of the receiver is now receiving only the normal radiowave signal, the first series circuit is established in the receiver. Since the main switch is OFF, the receiver continuously receives the normal radiowave signal through the first series circuit described above without any interruptions. Therefore, the AGC signal produced from the AM detector 14 is comparatively low. Upon closure of the main switch 10, electric power is supplied to the second mixer 16, second oscillator 18, second switching circuit 26, adjusting circuit 28 and detector 22 and, at the same time, to the base of transistor $Q_5$ in the first switching circuit to cause this transistor to conduct. Thereupon, the low AGC signal is fed to the base of the transistor $Q_3$ causing the transistor $Q_3$ to conduct. Since the level of the AGC signal is comparatively low, the amount of collectoremitter current of the transistor $Q_3$ is small and, therefore, a voltage drop across the resistor $R_7$ is small and a voltage level appearing on the lead line 38 is comparatively high. The high voltage level on the lead line 38 is applied to the base of the transistor $Q_6$. Since transistor $Q_6$ is of PNP type transistor, the application of such high voltage to the base thereof causes the transistor $Q_6$ to be cut off. Accordingly, the voltage level at the collector of the transistor $Q_6$ is low and, in turn, the transistor $Q_7$ is cut off. As a consequence, the signal applied to the first terminal of the integrated circuit 42 is high.

To summarize the above described condition, it is understood that, when the AGC signal is comparatively low, that is, below a predetermined level, the signal applied to the first terminal of the integrated circuit 42 is in a high level state. On the contrary, when the AGC signal is comparatively high, that is, above the predetermined level, the signal applied to the first terminal of the integrated circuit 42 is at a low level state. It is understood that the latter case occurs when there is no signal received by the receiver.

It is to be noted that the signal produced from the transistor $Q_7$ applied to the first terminal of the integrated circuit 42, as well as the signal produced from NAND elements 44, 46, 48 and 50 contained in the integrated circuit 42 is in the form a binary signal, which may be either a high level binary signal or low level binary signal.

Upon application of the power to the detector 22 during the closure of the main switch 10, the pulsating signal, as shown by the waveform A in FIG. 2 is produced from the astable multi-vibrator constituted by the NAND elements 48 and 50 through the eighth terminal of the integrated circuit 42. Such pulsating signal changing its state between high and low level states is fed to one of the two inputs of the NAND element 46 through the fifth terminal to control the NAND element 46 to produce a pulsating signal reversed in phase to the phase of the input pulsating signal. The description hereinbelow is given to four different cases with reference to FIGS. 2, 3 and 4.

(I) Normal radiowave signal is received through the first series circuit during the period $P_1$.

When the sixth terminal of the integrated circuit 42 is producing a low level binary signal, the transistor $Q_9$ is cut off and, thus, the transistor $Q_{10}$ is conducting. Therefore, a junction $J_2$ between the resistors $R_{13}$ and $R_{14}$ is grounded. Accordingly, the transistor $Q_4$ is inoperative and, as a result, the second oscillator 18 is maintained inoperative. During the same time, the transistor $Q_8$ is cutoff to cause the emitter of the transistor $Q_2$ to be connected to the ground through the resistor $R_{18}$. Therefore, the transistor $Q_2$ is maintained operative to properly function as the first mixer 6 and, as a consequence, the first series circuit described above is established in the receiver to receive the normal radiowave signal.

Upon receipt of such normal radiowave signal, the AGC signal produced from the AM detector 14 becomes low and, as a consequence, the first terminal of the integrated circuit 42 receives a high level binary signal. Since the second terminal receives the low level binary signal from the sixth terminal, the signal produced from the NAND element 44 is a high level binary signal, which is applied to one of the inputs of the NAND element 46. The other input of the NAND element 46 receives a high level binary signal from the astable multi-vibrator and, thus the NAND element 46 produces a low level binary signal. The above described flow of signal satisfies the case when the antenna 2 receives only the normal radiowave signal within the period $P_1$.

(II) No priority signal is received through the second series circuit during the period $P_2$.

In the next time period, that is, in the period $P_2$, the sixth terminal of the integrated circuit 42 produces a high level binary signal upon receipt of a low level binary signal from the astable multi-vibrator to one of the inputs of the NAND element 46. The high level binary signal from the NAND element 46 is supplied to the base of the transistor $Q_8$. Thus, the transistor $Q_8$ conducts to supply voltage from the power source to the emitter of the transistor $Q_2$. As a result, the first mixer 6 is cut off. During the same time, upon receipt of the high level binary signal from the NAND element 46, the transistor $Q_9$ conducts to cause the transistor $Q_{10}$ to be cut off. Therefore, the transistor $Q_4$ is supplied with a proper voltage to operate as the second oscillator 18 and, as a consequence, the second series circuit is established in the receiver. During this period, which corresponds with the period $P_2$, the receiver is ready to receive the priority signal. Since in this case, the antenna 2 receives no priority radiowave signal in the period $P_2$, the AGC signal becomes high and, as a consequence, the first terminal of the integrated circuit 42 receives a low level binary signal, which is fed to one of the inputs of the NAND element 44. Therefore, the NAND element 44 produces a high level binary signal in either of the cases when the other input thereof is supplied with low or high level binary signal through the second terminal. This high level binary signal produced from the NAND element 44 is applied to one of the two inputs of the NAND element 46. The other input of the NAND element 46 is applied with a low level binary signal from the astable multi-vibrator. Therefore, the NAND element 46 produces a high level binary signal. Therefore, the above described flow of signal satisfies the case when the antenna 2 receives no priority radiowave signal, but possibly the normal radiowave signal, within the period $P_2$.

(III) Priority radiowave signal is received through the second series circuit during the period $P_2$.

The sixth terminal of the integrated circuit 42 produces a high level binary signal upon receipt of a low level binary signal from the astable multi-vibrator to one of the inputs of the NAND element 46. The high level binary signal from the NAND element 46 is supplied to the transistors $Q_8$ and $Q_9$ and establishes the second series circuit in the same manner described above in the case II). Upon receipt of the priority radiowave signal through the second series circuit, the AGC signal becomes low and, as a consequence, the first terminal of the integrated circuit 42 receives a high level binary signal. Since the second terminal also receives the high level binary signal from the sixth terminal, the signal produced from the NANd element 44 is a low level binary signal. Such low level binary signal is applied to one of the inputs of the NAND element 46. Therefore, the NAND element 46 produces a high level binary signal in either of the cases when the other input thereof is supplied with low or high binary signal through the fifth terminal. In other words, the NAND element 46 is locked to continually produce a high level binary signal by the low level binary signal applied to the input thereof. Such locked condition continues until the signal applied to the first terminal changes its state from a high to a low level binary signal. Such change in the signal applied to the first terminal is obtained when the priority radiowave signal is over, that is, when the second series circuit stops receiving the priority radiowave signal. When the locked condition is released, the receiver functions to receive the normal radiowave signal intermittently in the same manner described above.

(VI) No radiowave is received through the first and second series circuit.

When no radiowave signal is received, the AGC signal produced from the AM detector 14 is high, and thus, the first terminal of the integrated circuit 42 is supplied with a low level binary signal, which is fed to one of the inputs of the NAND element 44. Accordingly, the NAND element 44 produces a high level binary signal in either case when the other input of the NAND element 44 is supplied with high or low level binary signal. Such high level binary signal produced from the NAND element 44 is applied to one of the inputs of the NAND element 46 through the third and fourth terminals. The NAND element 46, upon receipt of the pulsating signal from the astable multi-vibrator, produces a pulsating signal reversed in phase to the phase of the astable multi-vibrator.

In the fourth case described above, the receiver alternately establishes the first and second series circuits.

In order to adjust the reactance of the coils $L_5$, $L_6$ and $L_7$ employed in the receiver, the receiver is forcibly locked to supply a high level binary signal to the first terminal by the termination of a contacting arm in the variable resistor $VR_2$ to the leftmost position. For determining the predetermined level for dividing the AGC signal between high and low, the contacting arm is slidingly moved to an appropriate position of the variable resistor $VR_2$.

In order to indicate the reception of the priority radiowave signal, the light emitting diode LED is energized during a period when the second series circuit is established. Even when the priority signal is not received by the second series circuit during the period $P_2$, the light emitting diode LED is supplied with power. However, since the period $P_2$ is such a short time, for example, between 100 to 200 milliseconds, the light emitting diode would not be lit enough to be distinguished by the human eyes. On the other hand, when the second series circuit receives the priority radiowave signal, then the light emitting diode LED is supplied with the power for a long time which is enough to light the light emitting diode LED. Thus, the operator is informed that the receiver is receiving the priority radiowave signal.

In the case when the operator wishes not to receive the priority radiowave signal, he may keep the main switch 10 opened. Thereupon the transistor $Q_5$ is maintained inoperative to prevent the AGC signal from being transmitted to the transistor $Q_3$ of the second mixer 16. In the case when the AGC signal is supplied to the transistor $Q_3$ upon closure of the main switch 10, the AGC signal is further transmitted to the detector 22 through the adjusting circuit 28. However, in this case, since the input impedance of the transistor $Q_3$, expressed by the produce of coefficient $h_{FE}$ of DC current amplification of the transistor $Q_3$ and the resistance of a resistor $R_E$, is considerably high, a small amount of the current component of the AGC signal leaks through the transistor $Q_3$. Furthermore, during the opening of the switch 10, the employment of the switching transistor $Q_5$ prevents the current component of the AGC signal from flowing through the transistor $Q_3$ to ground. Therefore, the AGC signal scarcely changes with respect to the change of the main switch 10 and, thus, there is no substantial difference in quality of received signal between closed and opened states of the main switch 10.

It is to be noted that the first oscillator 8 which has been described as employing a PLL circuit can employ a crystal oscillator as it is employed in the second oscillator 18. In this case, the second switching circuit 26 which has been described as connected to the first mixer 6 and the second oscillator 18 can be connected to the first and second oscillators 8 and 18. For allowing a number of different channels of normal radiowave signals to be received by the first series circuit, the first oscillator 8 may be provided with a plurality of quartz-crystal oscillators which may be selectively connected to function in the first oscillator 8.

According to the receiver of the present invention, the circuit for receiving the normal radiowave signal and the circuit for receiving the priority radiowave signal are established by a simple arrangement of the mixer coupled with the oscillator provided at the front end portion of the receiver. Therefore, the receiver can be made in a compact size. Furthermore, since the receiver uses the AGC signal for detecting whether or not the priority radiowave signal is received, there is no need to provide any other detecting means to detect the presence of such priority radiowave. Moreover, there is no difference in received signal between the cases when the main switch 10 is open or closed.

Although the present invention has been fully described by way of examples with reference to the accompanying drawings, it is to be noted that various changes and modifications are apparent to those skilled in the art. For example, the first series circuit established in the receiver may have another pair of first mixer and first oscillator connected between the first mixer 6 and the intermediate frequency amplifier 12 so as to establish a double superheterodyne type receiver. Therefore, such changes and modifications are, unless they depart from the true scope of the present invention, to be understood as included therein.

What is claimed is:

1. A receiver of the superheterodyne type for receiving radio wave signals on a predetermined number of channels, at least one of which is designated a priority channel while others are nonpriority channels, said receiver comprising in combination:
   first circuit means operative to provide reception of a signal on said nonpriority channels;
   second circuit means operative to provide reception of a signal on said priority channel;
   means for producing an automatic gain control signal, said automatic gain control signal varying from a first controlling level during reception of any one of said signals to a second controlling level during the reception of no signal;
   switching means coupled to said first and second circuit means and having at least first and second conditions of operation, the first condition being wherein the first circuit means is made operative and the second condition being wherein the second circuit means is made operative;
   pulse generating means for providing to said switching means pulses having first and second output levels, said first output level causing the switching means to operate in the first condition and said second output level causing the switching means to operate in the second condition;
   means for detecting the reception of a priority channel by the second circuit means in response to the variation of the automatic gain control signal to the first controlling level during a period in which the pulse generating means produces the second output level; and
   means responsive to the detection of the detecting means for locking the pulse generating means to inhibit the generation of pulses and to continually produce the second output level.

2. A receiver according to claim 1, wherein the first circuit means comprises first mixing means and first oscillator means connected to the first mixing means for providing output signals to the first mixing means at different frequencies corresponding to said different nonpriority channels to be received.

3. A receiver according to claim 2, wherein the second circuit means comprises second mixing means connected in parallel to the first mixing means and second oscillator means connected to the second mixing means for providing an output signal to the second mixing means at a frequency corresponding to the priority channel to be received.

4. A receiver according to claim 3, wherein the switching means is connected to said first oscillator means and to said second oscillator means to control the operation thereof.

5. A receiver according to claim 3, wherein the switching means is connected to first mixing means and second oscillator means to control the operation thereof.

6. A receiver according to claim 1 further comprising a control switching means having first and second states, said control switching means in the first state enabling said pulse generating means, detecting means and locking means and in the second state disabling said switching means, pulse generating means, detecting means and locking means to thereby continuously operate the first circuit means.

7. A receiver according to claim 6, wherein the control switching means includes a manually operable switch for establishing the first state upon closure thereof and for establishing the second state upon opening thereof, and a switching transistor connected to the manually operable switch, said switching transistor, when said manually operable switch is closed, supplying the automatic gain control signal to the detecting means and, when manually operable switch is opened, supplying no automatic gain control signal to the detecting means.

8. A receiver according to claim 1, further comprising means for indicating the reception on the priority channel.

9. A receiver according to claim 8, wherein the indicating means is a light emitting diode which produces light during a period in which the output from the pulse generating means is locked in the second output level.

10. A receiver according to claim 1, wherein the signals on a predetermined number of channels are AM signals.

* * * * *